US009349866B2

(12) United States Patent
Ching

(10) Patent No.: US 9,349,866 B2
(45) Date of Patent: May 24, 2016

(54) STRUCTURE AND METHOD FOR FINFET DEVICE

(71) Applicant: Taiwan Semiconductor Manufacturing Company, Ltd., Hsin-Chu (TW)

(72) Inventor: Kuo-Cheng Ching, Hsinchu County (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 14/511,412

(22) Filed: Oct. 10, 2014

(65) Prior Publication Data
US 2016/0104793 A1 Apr. 14, 2016

(51) Int. Cl.
H01L 29/78 (2006.01)
H01L 29/66 (2006.01)

(52) U.S. Cl.
CPC ........ H01L 29/785 (2013.01); H01L 29/66795 (2013.01); H01L 29/7841 (2013.01)

(58) Field of Classification Search
CPC ................................................. H01L 29/42392
See application file for complete search history.

(56) References Cited

U.S. PATENT DOCUMENTS

| 2007/0200178 A1* | 8/2007 | Yun ................... H01L 29/42392 257/353 |
| 2014/0166983 A1* | 6/2014 | Cohen ............... H01L 29/42392 257/29 |
| 2014/0225065 A1* | 8/2014 | Rachmady ........ H01L 29/42392 257/24 |

* cited by examiner

Primary Examiner — Daniel Whalen
(74) Attorney, Agent, or Firm — Haynes and Boone, LLP

(57) ABSTRACT

The present disclosure provides an embodiment of a fin-like field-effect transistor (FinFET) device. The device includes a fin structure disposed over a substrate. The fin structure includes a semiconductor oxide layer disposed over the substrate, which has a top surface facing away from the substrate, a first semiconductor material layer disposed over and spaced apart from the semiconductor oxide layer, which has a top surface facing away from the substrate and an opposing bottom surface facing the substrate, and a dielectric sidewall spacer disposed along a sidewall of the semiconductor oxide layer and extending to the first semiconductor material layer. The device also includes a gate dielectric layer disposed over the fin structure and a gate electrode layer disposed over the gate dielectric layer. The gate electrode extends between the top surface of the semiconductor oxide layer and the bottom surface of the first semiconductor material layer.

20 Claims, 20 Drawing Sheets

STRUCTURE AND METHOD FOR FINFET DEVICE

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-like field-effect transistor (FinFET), has been introduced to replace a planar transistor. Although existing FinFET devices and methods of fabricating FinFET devices have been generally adequate for their intended purposes, they have not been entirely satisfactory in all respects.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

FIGS. 2 to 8A are diagrammatic perspective views of an example FinFET device undergoing processes in accordance with some embodiments.

DETAILED DESCRIPTION

Figure 1:
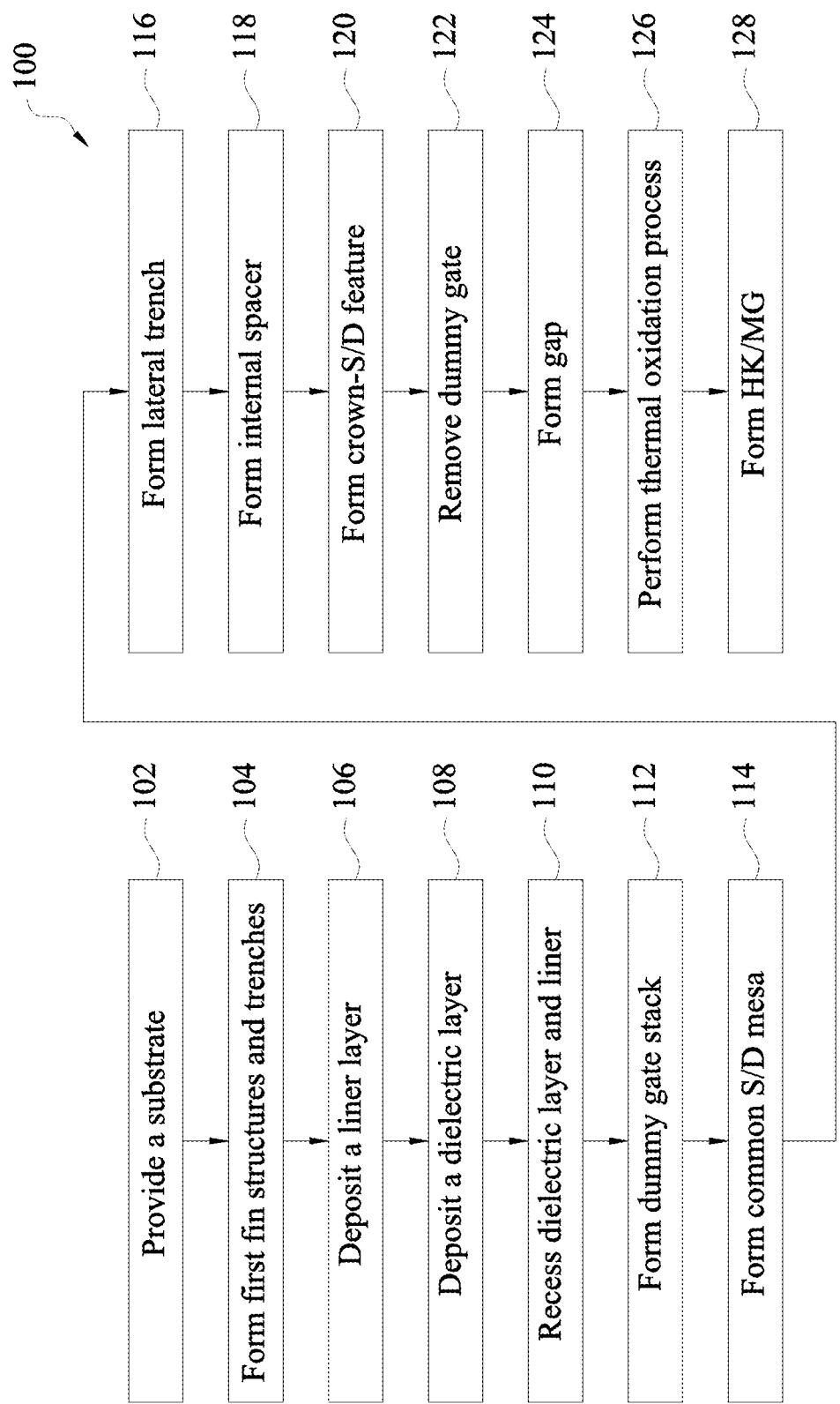
FIG. 1 is a flow chart of an example method for fabricating a FinFET device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

FIG. 1 is a flowchart of a method 100 for fabricating a FinFET device 200 in accordance with some embodiments. It is understood that additional steps may be implemented before, during, and after the method, and some of the steps described may be replaced or eliminated for other embodiments of the method. The FinFET device 200 and the method 100 making the same are collectively described with reference to various figures.

Figure 2:
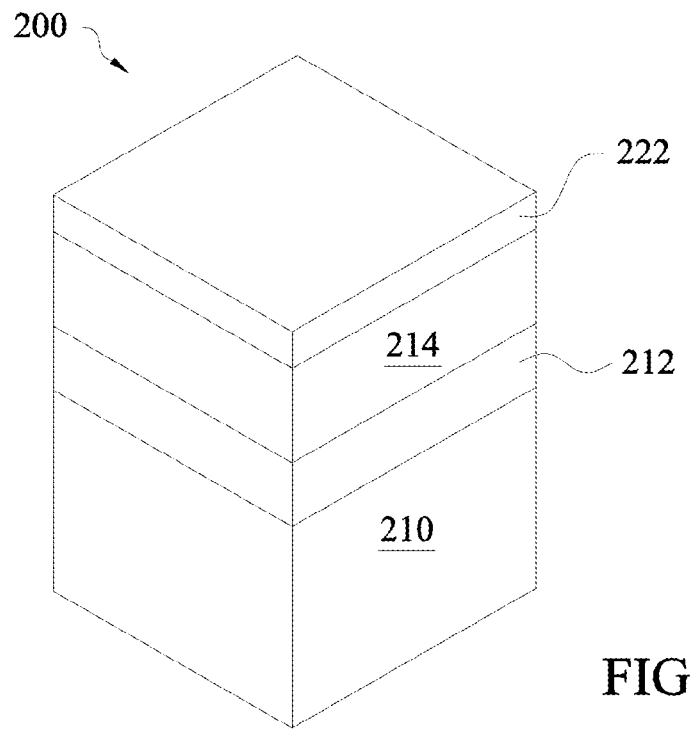

Referring to FIGS. 1 and 2, the method 100 begins at step 102 by providing a substrate 210. The substrate 210 may include a bulk silicon substrate. Alternatively, the substrate 210 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof.

In another embodiment, the substrate 210 has a silicon-on-insulator (SOI) structure with an insulator layer in the substrate. An exemplary insulator layer may be a buried oxide layer (BOX). The SOI substrate may be fabricated using separation by implantation of oxygen (SIMOX), wafer bonding, and/or other suitable methods.

In the present embodiment, a first semiconductor material layer 212 is deposited over the substrate 210 and a second semiconductor material layer 214 disposed over the first semiconductor material layer 212. The first and second semiconductor material layers, 212 and 214, are different from each other. The first semiconductor material layer 212 has a first lattice constant and the second semiconductor material layer 214 has a second lattice constant different from the first lattice constant. In the present embodiment, the first semiconductor material layer 212 includes silicon germanium (SiGe), and the second semiconductor material layers 214 includes silicon. In various examples, the first and the second semiconductor material layers, 212 and 214, may include germanium (Ge), silicon (Si), gallium arsenide (GaAs), aluminum gallium arsenide (AlGaAs), silicon germanium (SiGe), gallium arsenide phosphide (GaAsP), or other suitable materials. In one embodiment, the first and the second semiconductor material layers, 212 and 214, are deposited by epitaxial growth, referred to as a blanket channel epi. In various examples, the epitaxial processes include chemical vapor deposition (CVD), deposition techniques (e.g., vapor-phase epitaxy (VPE) and/or ultra-high vacuum CVD (UHV-CVD)), molecular beam epitaxy, and/or other suitable processes.

A fin hard mask (FHM) layer 222 is formed over the second semiconductor material layer 214. The FHM layer 222 includes silicon oxide, silicon nitride, silicon oxynitride, or any other suitable dielectric material. The FHM layer 222 may include a single material layer or multiple material layers. The FHM layer 222 may be deposited by thermal oxidation, CVD, atomic layer deposition (ALD), or any other appropriate method.

The substrate 210 may include various doped features depending on design requirements as known in the art. In some embodiment, the substrate 210 may include various doped regions depending on design requirements (e.g., p-type substrate or n-type substrate). In some embodiment, the doped regions may be doped with p-type or n-type dopants. For example, the doped regions may be doped with p-type dopants, such as boron or $BF_2$; n-type dopants, such as phosphorus or arsenic, and/or combination thereof. The doped regions may be configured for an n-type FinFET (NFET), or alternatively configured for a p-type FinFET (PFET).

Figure 3:
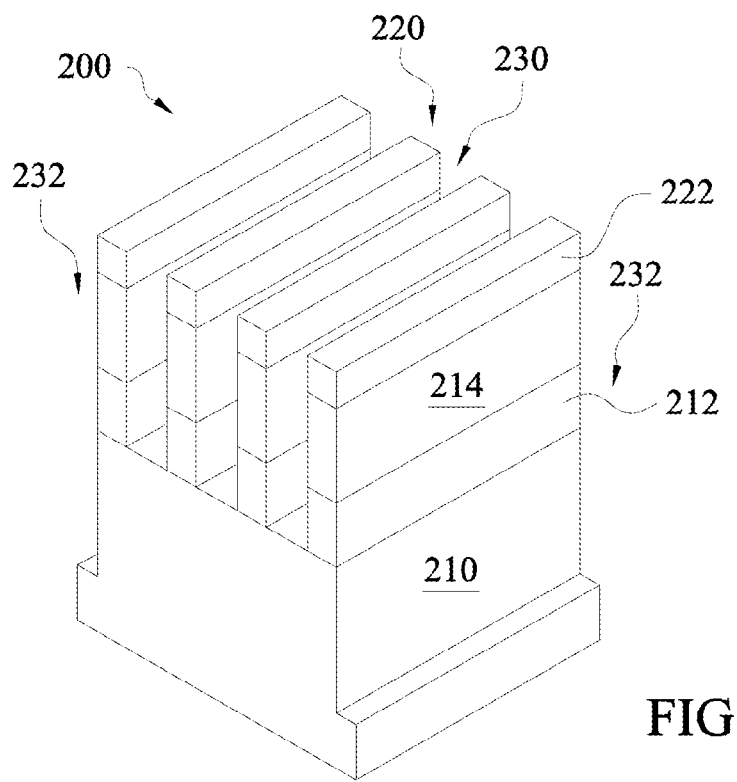

Referring to FIGS. 1 and 3, the method 100 proceeds to step 104 by forming first fins 220 and first trenches 230 over the substrate 210. In one embodiment, the (FHM) layer 222 is patterned first by forming a patterned photoresist (resist) layer by a lithography process, and the etching the FHM layer 222 through openings of the patterned photoresist layer. The substrate 210 is then etched through the patterned FHM layer 222 to form the first fins 220 and the first trenches 230. The etching process may include a wet etch or a dry etch. In one embodiment, the wet etching solution includes a tetramethylammonium hydroxide (TMAH), a $HF/HNO_3/CH_3COOH$ solution, or other suitable solution. The respective etch process may be tuned with various etching parameters, such as etchant used, etching temperature, etching solution concentration, etching pressure, source power, RF bias voltage, RF bias power, etchant flow rate, and/or other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanism as DRIE (deep reactive-ion etching).

In the present embodiment, an etching depth is controlled such that the first and the second semiconductor material layers, 212 and 214 are exposed in the first trench 230. As shown, first fins 220 have the second semiconductor material layer 214 as an upper portion and the first semiconductor material layer 212 as a lower portion.

Still referring to FIG. 3, in one embodiment, second trenches 232 are formed over the substrate 210 as well. The second trenches 232 are deeper and wider than the first trenches 230. As shown, in some embodiments, there are multiple first trenches 230 and multiple first fins 220 disposed between between second trenches 232. The second trenches 232 may be formed by patterning and etching processes, which are similarly in many respects to the formation of the first trench 230.

Figure 4:
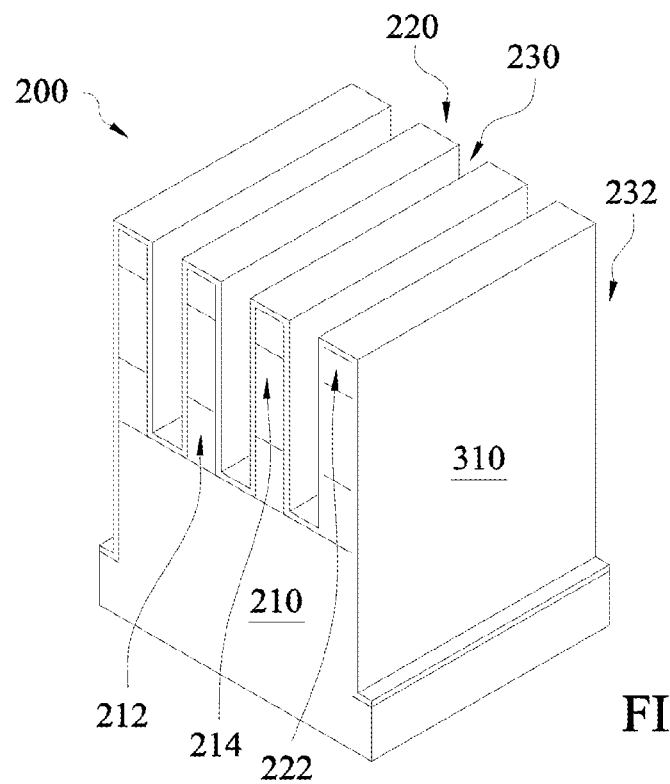

Referring to FIGS. 1 and 4, the method 100 proceeds to step 106 by conformably depositing a liner 310 that wraps over first fins 220. In the present embodiment, the liner 310 includes silicon nitride, silicon oxynitride, aluminum oxide, or other suitable materials. The liner 310 is deposited by ALD to achieve adequate film coverage of wrapping over the first fins 220. Alternatively, the liner 310 may be deposited by CVD, physical vapor deposition (PVD), or other suitable techniques.

Figure 5:
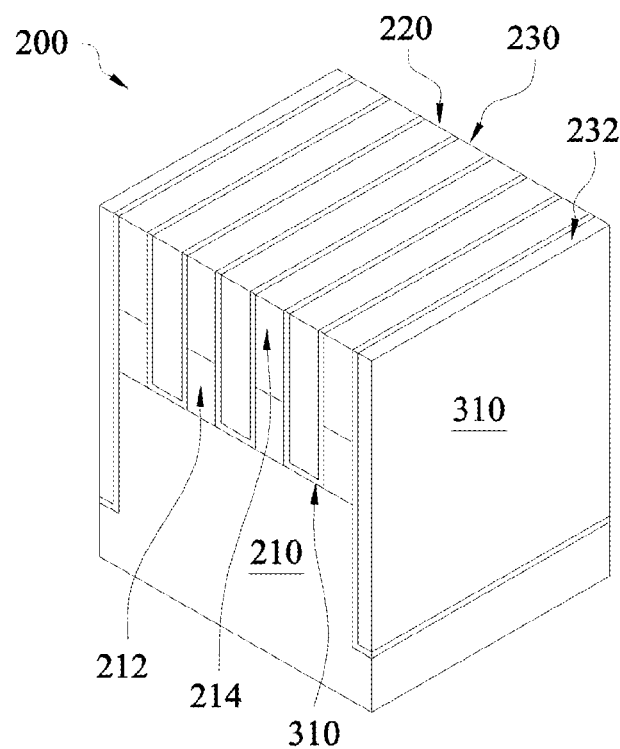

Referring to FIGS. 1 and 5, the method 100 proceeds to step 108 by depositing a dielectric layer 320 over the substrate 210, including filling in the first and second trenches, 230 and 232. The dielectric layer 320 may include silicon oxide, silicon nitride, silicon oxynitride, spin-on-glass, spin-on-polymer, or other suitable materials, or combinations thereof. The dielectric layer 320 may be deposited by CVD, PVD, ALD, thermal oxidation, spin-on coating, or other suitable techniques, or a combination thereof. Having the liner 310 covered the first fin 220, it provides a buffer to adverse impacts induced during the formation of the dielectric layer 320, such as in thermal curing process for the dielectric layer 320. A chemical mechanical polishing (CMP) process may be performed to remove excessive dielectric layer 320 and planarize the top surface of the dielectric layer 320. In one embodiment, the FHM layer 222 is removed by the CMP process as well.

Figure 6:
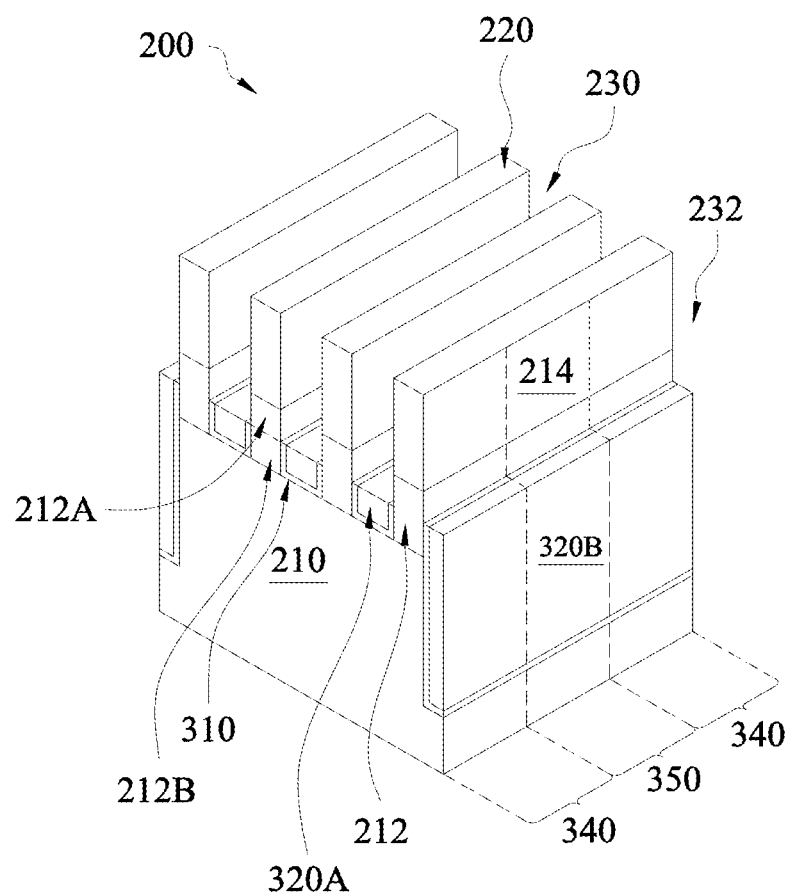

Referring to FIGS. 1 and 6, the method 100 proceeds to step 110 by recessing the liner 310 and the dielectric layer 320. In the present embodiment, after recessing the liner 310 and the dielectric layer 320, the second semiconductor material layer 214 and an upper portion of the first semiconductor material layer 212 of the first fin 220 are exposed in the first and second trenches, 230 and 232, while a lower portion of the first semiconductor material layer 212 is embedded in the recessed dielectric layer 320. The upper protion of the first semiconductor material layer 212 is referred to as 212A and the embedded portion of the first semiconductor material layer 212 is referred to as 212B. The remaining dielectric layer 320 in the first trenches 230 is referred to as dielectric layer 320A while in the second trenches 232 is referred to as dielectric layer 320B. In one embodiment, a thickness of dielectric layer 320A is in a range of about 3 nm to about 15 nm. In some embodiments, the dielectric layer 320B is referred to as shallow trench isolation (STI) features. The liner 310 and the dielectric layer 320 are recessed by a proper etching process, such as a selective wet etch, a selective dry etch, or a combination thereof.

Referring also to FIG. 6, in some embodiments, the first fin 220 includes source/drain (S/D) regions 340 and gate regions 350. In furtherance of the embodiment, one of the S/D regions 340 is a source region, and another of the S/D regions 340 is a drain region. The S/D regions 340 are separated by the gate region 350.

Figure 7:
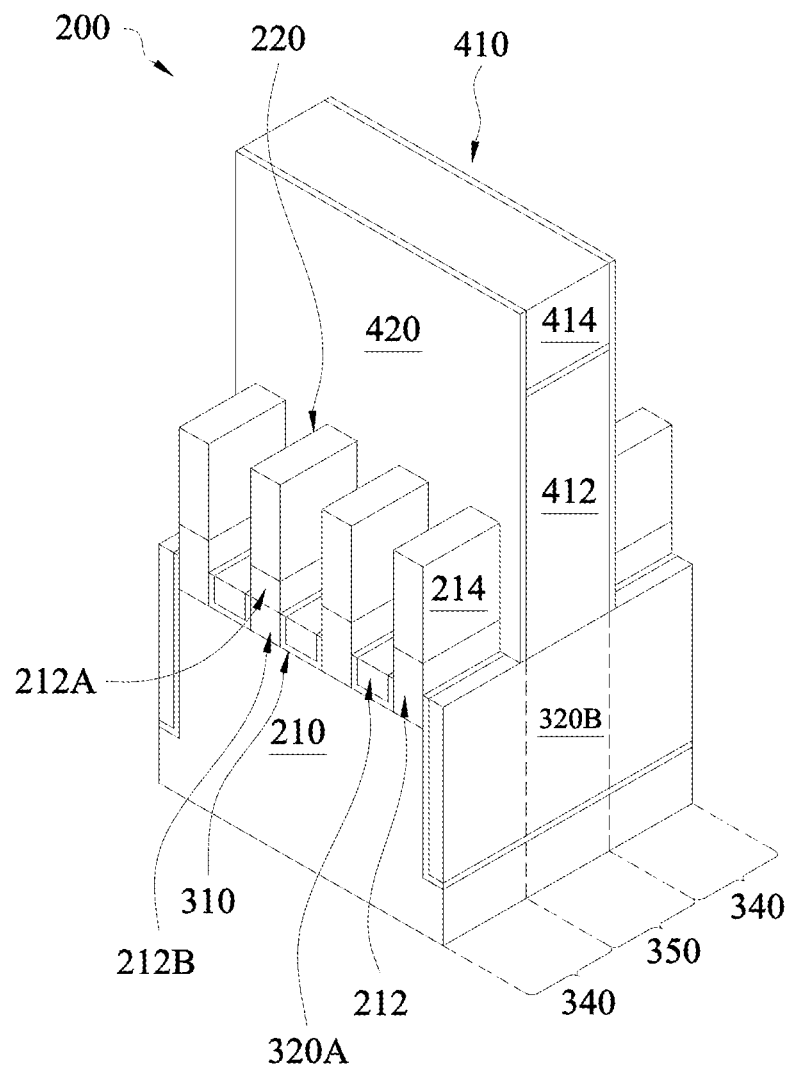

Referring to FIGS. 1 and 7, the method 100 proceeds to step 112 by forming a gate stack 410 and sidewall spacers 420 on sidewalls of the gate stack 410, in the gate region 350. In one embodiment using a gate-last process, the gate stack 410 is a dummy gate and will be replaced by the final gate stack at a subsequent stage. Particularly, dummy gate stack 410 is replaced later by a high-k (HK) dielectric layer and metal gate (MG) electrode after high thermal temperature processes, such as thermal annealing for S/D activation during a S/D formation. In one embodiment, the dummy gate stack 410 includes a dummy gate dielectric layer 412 and a poly silicon layer 414. The dummy gate stack 410 is formed by a suitable procedure including deposition and patterning. The patterning process further includes lithography and etching. In various examples, the deposition includes CVD, PVD, ALD, thermal oxidation, other suitable techniques, or a combination thereof. The lithography process includes photoresist coating, exposure and developing the photoresist, other suitable processes, and/or combinations thereof. The etching process includes dry etching, wet etching, and/or other etching methods (e.g., reactive ion etching).

Figure 8A:
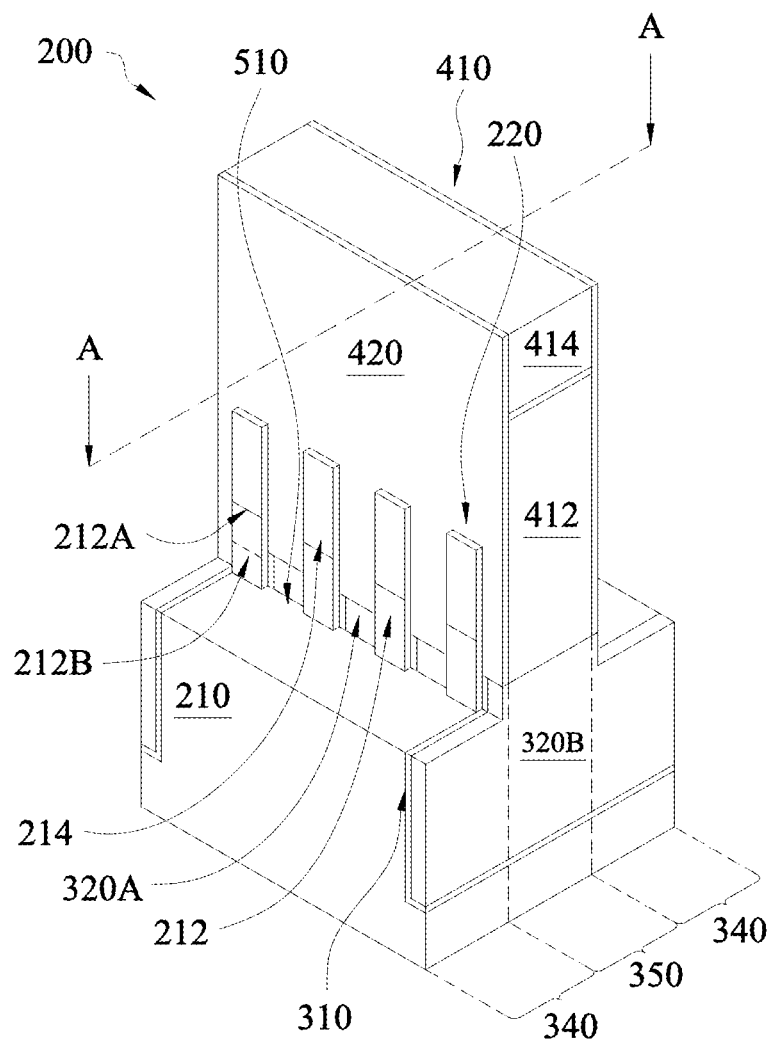
Figure 8B:
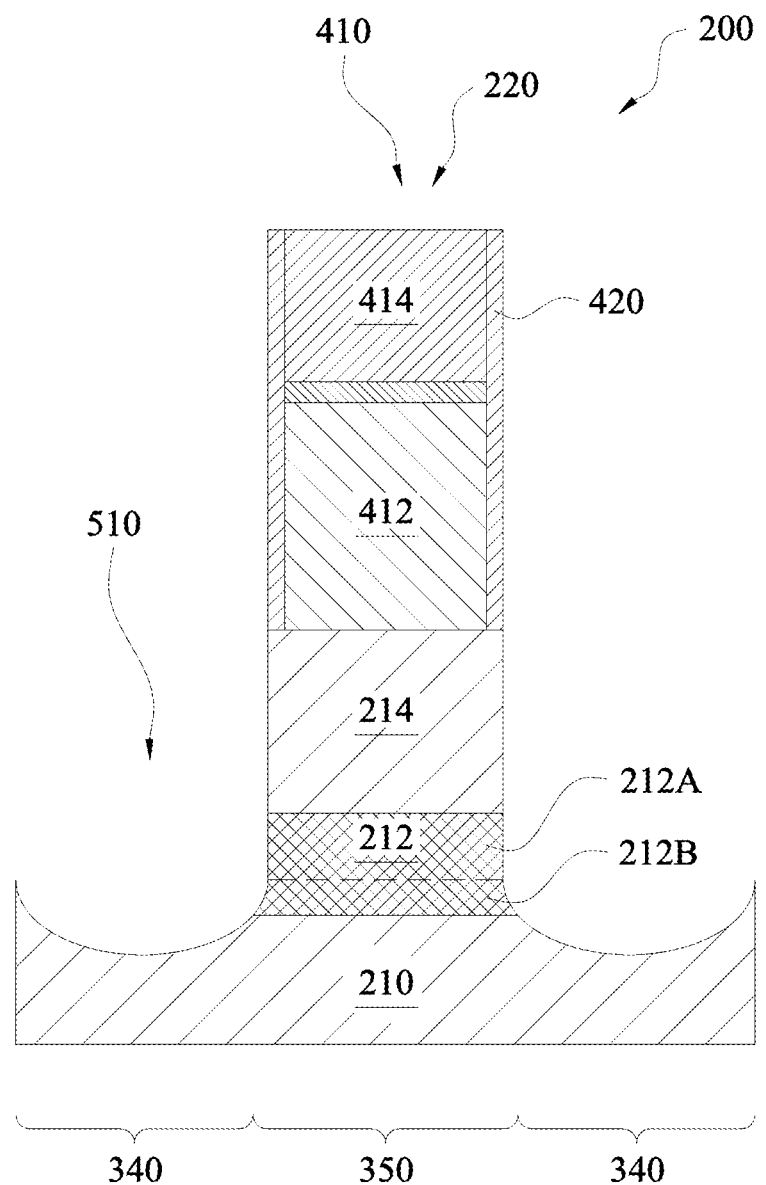
FIGS. 8B, 9-10, are cross-sectional views of an example FinFET device along the line A-A in FIG. 8A at fabrication stages constructed according to the method of FIG. 1.

Referring to FIGS. 1 and 8A-8B, the method 100 proceeds to step 114 by forming a common S/D mesa 510 in the S/D regions 340. In one embodiment, the common S/D mesa 510 is formed by recessing each individual first fins 220 and removing portions of dielectric layer 320A and 320B. The recessing process may include dry etching process, wet etching process, and/or combination thereof. The recessing process may also include a selective wet etch and/or a selective dry etch. The recessing process may include multiple etching processes. In the present embodiment, both of the upper and embedded portions (212A and 212B) of the first semiconductor material layer 212 of the first fin 220 in the gate region 350 is lateral exposed in the common S/D mesa 510.

Figure 9:
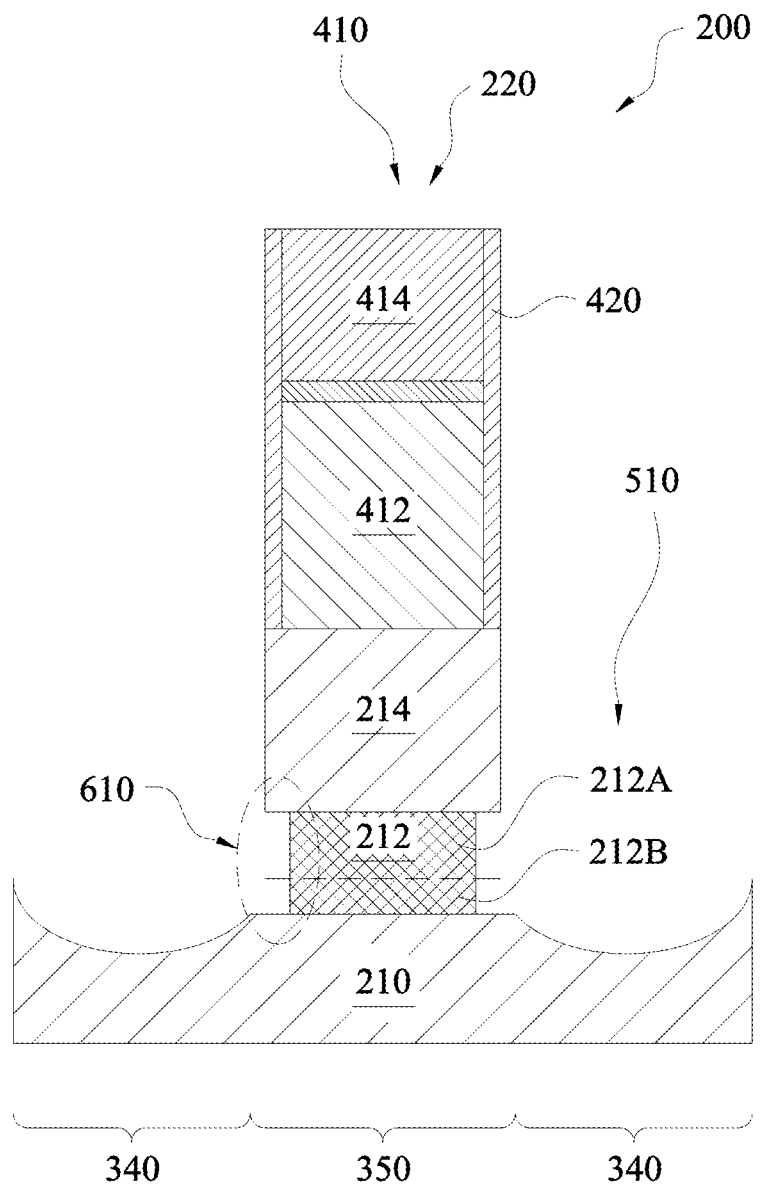

Referring to FIGS. 1 and 9, the method 100 proceeds to step 116 by forming a lateral trench 610 in the first fin 220 in the gate region 350. In one embodiment, the lateral trenches 610 are formed by selectively removing a portion of the first semiconductor material layer 212 of the first fin 220 in the gate region 350, but does not substantially etching the second semiconductor material layers 214, the substrate 210 and the dummy gate stack 410. The etching process may include a selective wet etch, a selective dry etch, or a combination thereof. In one embodiment, the lateral trench 610 is formed with a depth that is in a range of 5% to 25% of a width of remaining first semiconductor material layer 212

Figure 10:
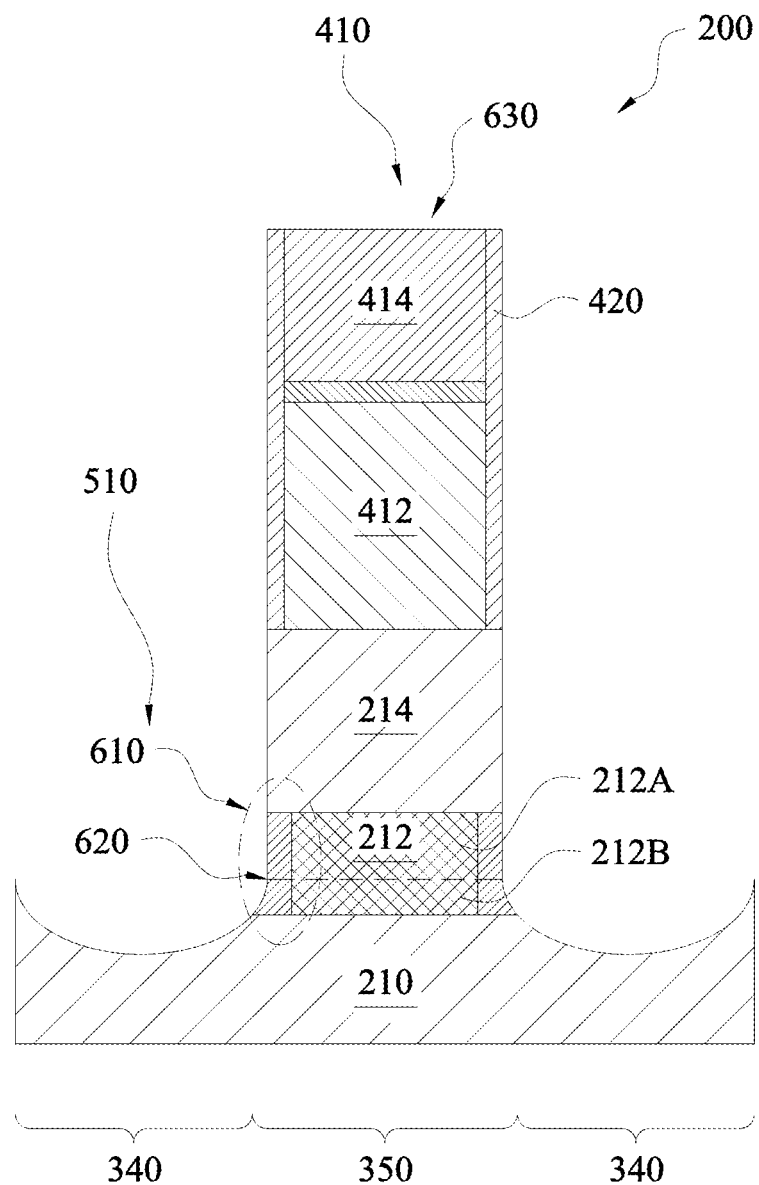

Referring to FIGS. 1 and 10, the method 100 proceeds to step 118 by forming dielectric sidewall spacer 620 in the lateral trench 610. The dielectric sidewall spacers 620 may include silicon oxide, silicon nitride, silicon oxynitride, or other suitable materials. In the present embodiment, the dielectric sidewall spacers 620 include silicon nitride. The dielectric sidewall spacers 620 may be formed by filling in the lateral trench 610 with an dielectric sidewall spacer layer and then anisotropic etching the dielectric sidewall spacer layer. By controlling etching process, the dielectric sidewall spacer layer outside of the lateral trench 610 is removed. The etching process may include an anisotropic dry etch, or other suitable etching processes. Thus, the dielectric sidewall spacer 620 covers sidewalls of the first semiconductor material layer 212, facing the common S/D mesa 510. In one embodiment, a width of the dielectric sidewall spacer 620 is in a range of about 2 nm to about 7 nm.

For the sake of clarity to better description, the first fin 220 in the gate region 350 (having the dielectric sidewall spacers 620) is referred to as a second fin 630, which has the first semiconductor material layer 212 with the dielectric sidewall spacer 620 as its lower portion and the second semiconductor material layer 214 as its upper portion. Outsides of the dielectric sidewall spacer 620 faces to the S/D region 340.

Figure 11A:
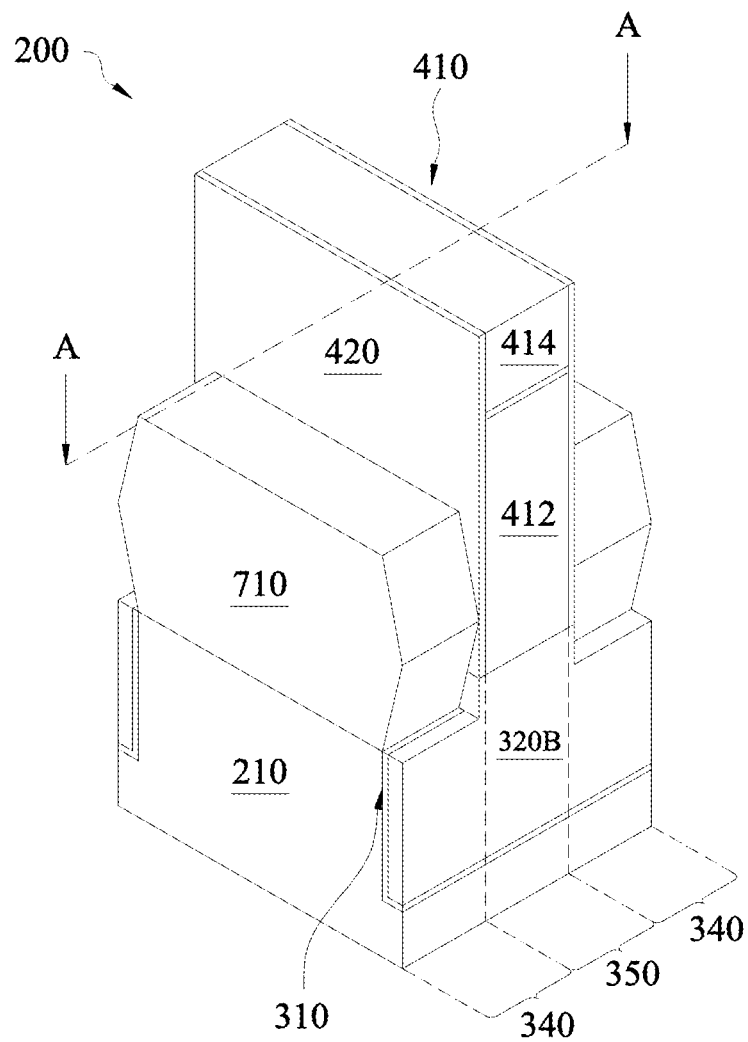
FIG. 11A is a diagrammatic perspective view of an example FinFET device undergoing processes in accordance with some embodiments.
Figure 11B:
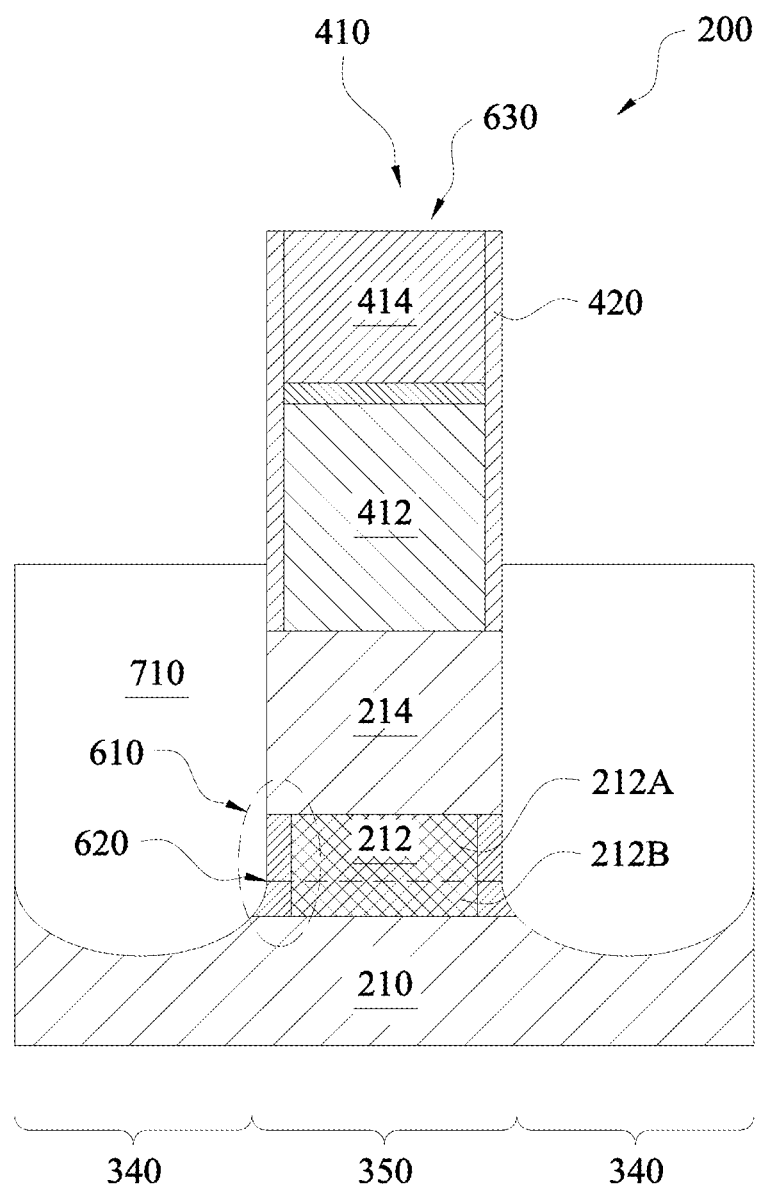
FIG. 11B is a cross-sectional view of an example FinFET device alone the line A-A in FIG. 11A at fabrication stages constructed according to the method of FIG. 1.

Referring to FIGS. 1 and 11A-11B, the method 100 proceeds to step 120 by forming crown-S/D feature 710 over the common S/D mesa 510. The crown-S/D features 710 may be formed by epitaxially growing a third semiconductor material layer over the common S/D mesa 510. The epitaxial processes include CVD deposition techniques (e.g., vapor-phase epitaxy (VPE) and/or ultra-high vacuum CVD (UHV-CVD)), molecular beam epitaxy, and/or other suitable processes. The crown-S/D features 710 may be formed by one or more epitaxy or epitaxial (epi) processes. The crown-S/D features 710 may be in-situ doped during the epitaxy process by introducing doping species including: p-type dopants, such as boron or $BF_2$; n-type dopants, such as phosphorus or arsenic; and/or other suitable dopants including combinations thereof. If the crown-S/D features 710 are not in-situ doped, an implantation process (i.e., a junction implant process) is performed to dope the crown-S/D features 710. In an exemplary embodiment, the crown-S/D features 710 in an NMOS include SiCP or SiP, while those in a PMOS include GeSnB (tin may be used to tune the lattice constant) and/or SiGeSnB. One or more annealing processes may be performed to activate S/D feature 710. The annealing processes comprise rapid thermal annealing (RTA) and/or laser annealing processes.

In the present embodiment, an inside of the crown-S/D features 710 physically contacts the dielectric sidewall spacer 620 and the second semiconductor material layer 214 of the second fin 630 in the gate region 350.

Figure 12A:
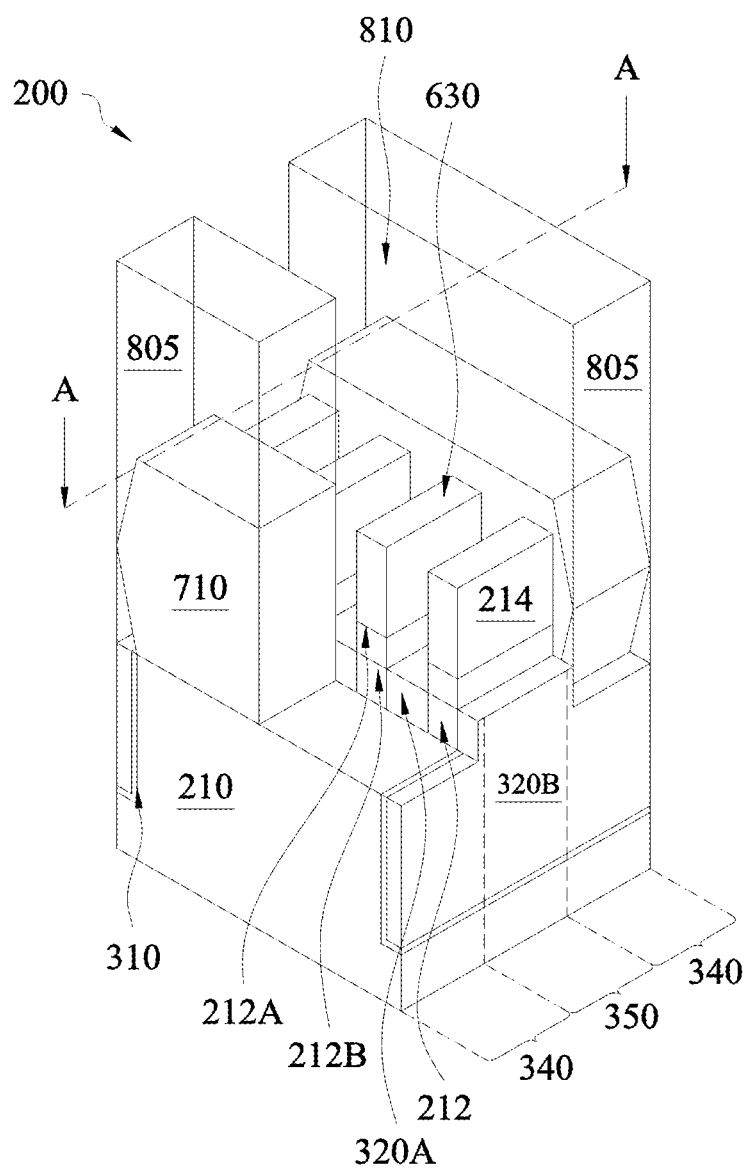
FIG. 12A is a diagrammatic perspective view of an example FinFET device undergoing processes in accordance with some embodiments.
Figure 12B:
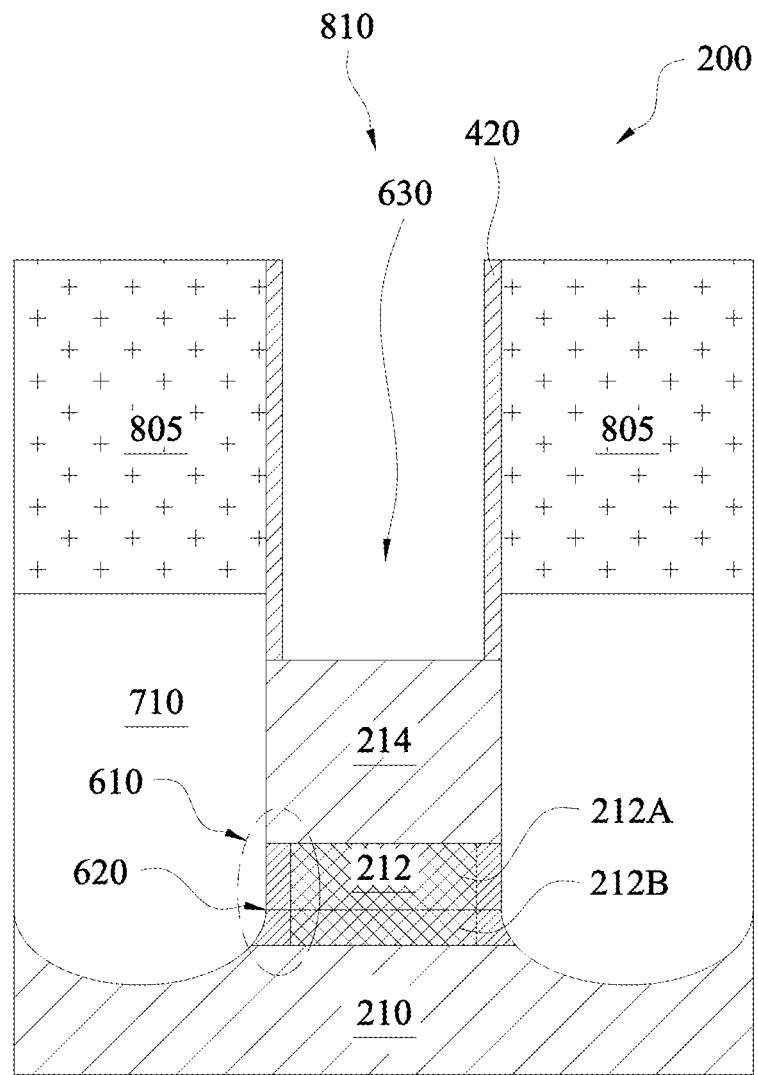
FIG. 12B is a cross-sectional view of an example FinFET device alone the line A-A in FIG. 12A at fabrication stages constructed according to the method of FIG. 1.

Referring to FIGS. 1 and 12A-12B, the method 100 proceeds to step 122 by removing the dummy gate stack 410 and resulting in a gate trench 810 in the gate region 350. Prior to removing the dummy gate stack 410, an interlayer dielectric (ILD) 805 is deposited over the substrate 210, including over the crown-S/D feature 710 and spaces between dummy gate stacks 410. The ILD 805 may also be part of an electrical interconnect structure that electrically interconnects devices. In such embodiments, the ILD 805 acts as an insulator that supports and isolates the conductive traces. The ILD 805 may include silicon oxide, oxynitride or other suitable materials. The ILD 805 may be formed by a suitable technique, such as CVD, ALD and spin-on (SOG). In one embodiment, a chemical mechanical polishing (CMP) process may be performed to remove excessive ILD 805 and exposed a top surface of the dummy gate stack 410.

The dummy gate stacks 410 are then removed by a process, such as a wet etch, a dry etch, or a combination thereof. In one embodiment, the dummy gate stacks 410 is selectively removed, but does not substantially etch the second semiconductor material layer 214, the dielectric sidewall spacer 620 and the first semiconductor material layer 212. The etching may include multiple etching steps to respective dummy gate layers. In the gate trench 810, the second semiconductor material layer 214 is exposed. The upper portion of the first semiconductor material layer 212 A is exposed in gate trench 810 as well.

Figure 13A:
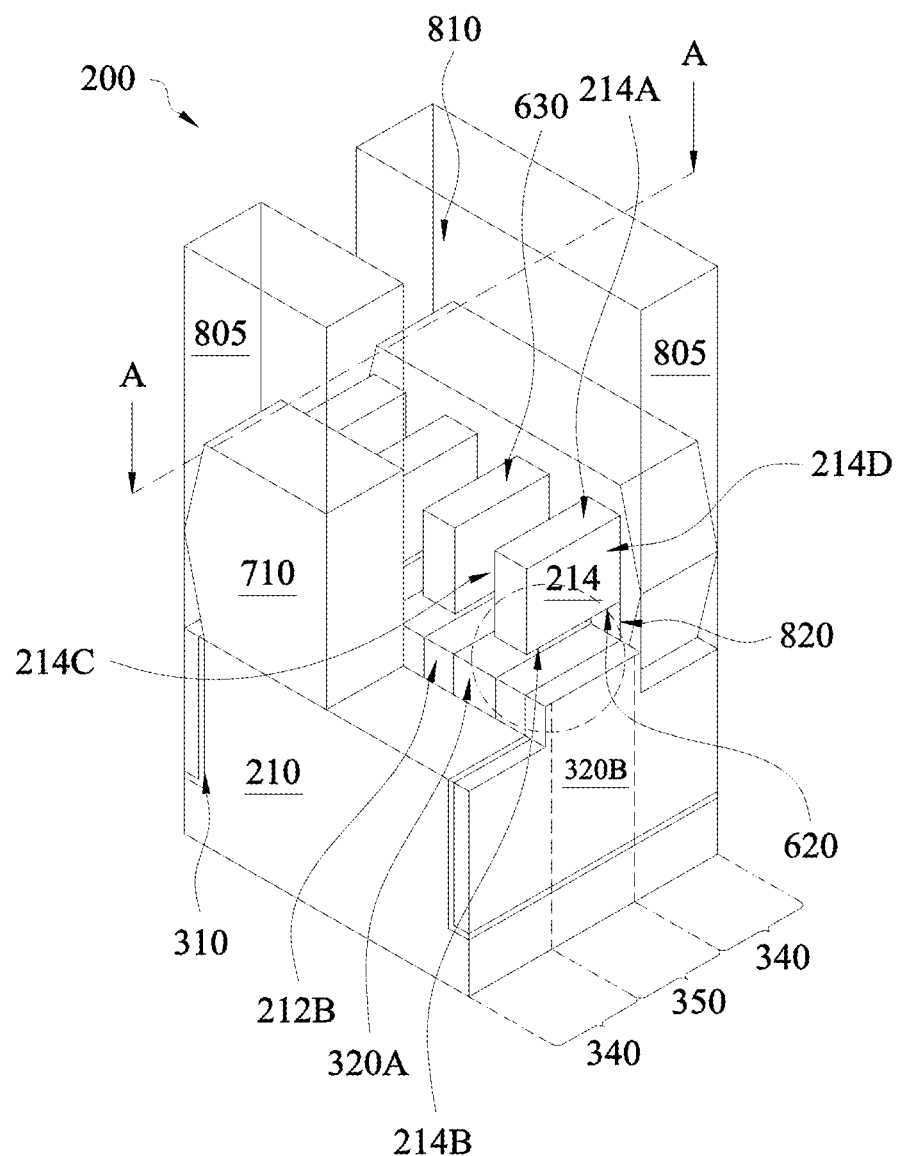
FIG. 13A is a diagrammatic perspective view of an example FinFET device undergoing processes in accordance with some embodiments.
Figure 13B:
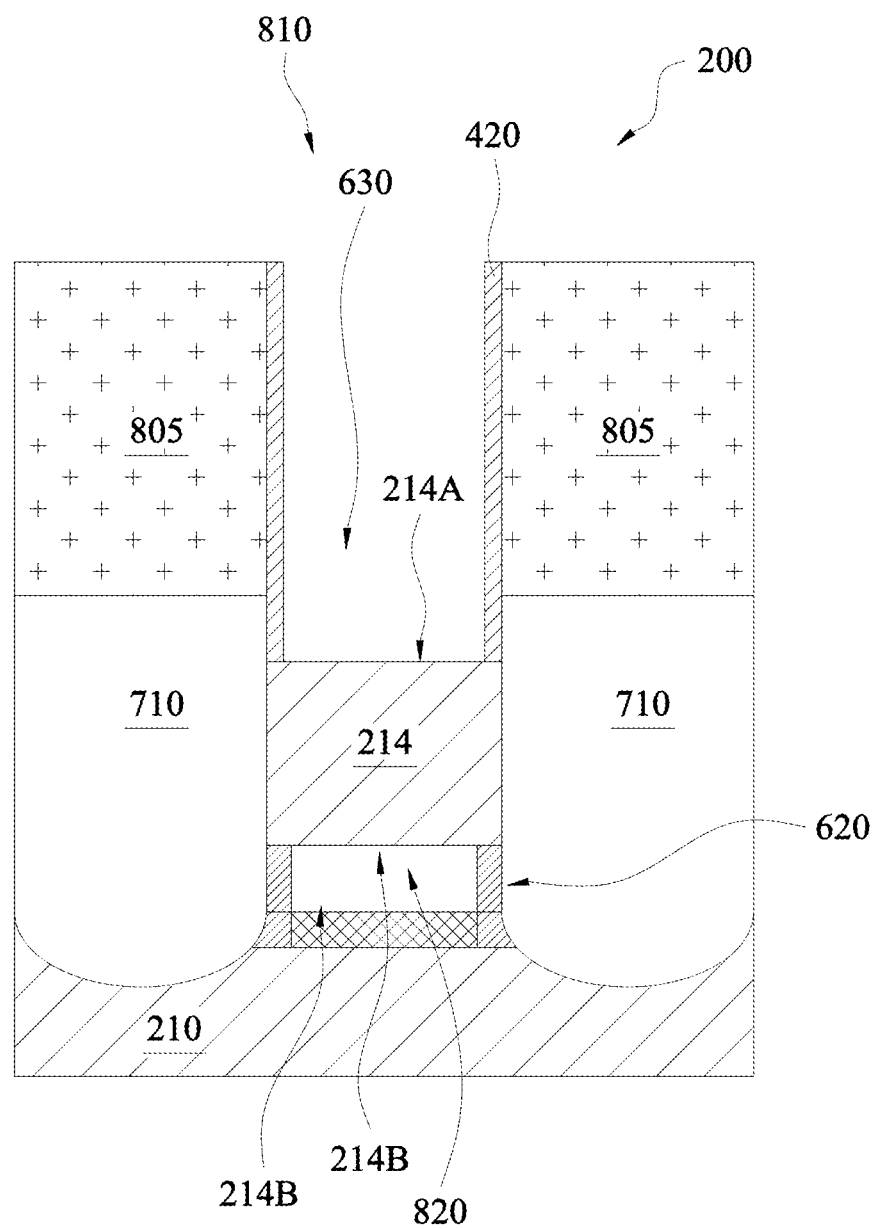
FIG. 13B is a cross-sectional view of an example FinFET device alone the line A-A in FIG. 13A at fabrication stages constructed according to the method of FIG. 1.

Referring to FIGS. 1 and 13A-13B, the method 100 proceeds to step 124 by removing upper portion of the first semiconductor material layer 212A in the gate trench 810 and resulting in a gap 820 between the embedded portion of the first semiconductor material layer 212B and the second semiconductor material layer 214. In another word, the embedded portion of the first semiconductor material layer 212B spaces apart from the second semiconductor material layer 214. The dielectric sidewall spacers 620 remain intact that they embrace the gap 820 at a side facing the common S/D feature 710. In one embodiment a height of the gap 820 is in a range of about 3 nm to about 15 nm. In the present embodiment, the gap 820 may be formed by a selective wet etch, a selective dry etch, or combination thereof. The etching selectively removes the upper portion of the first semiconductor material layer 212A but does not substantially etch the second semiconductor material layer 214, the dielectric sidewall spacer 620 and the dielectric layer 320A. Thus, dielectric layer 320A protects the embedded portion of the first semiconductor material layer 212B during the etching process. With the gap 820, the second semiconductor material layer 214 is exposed in the gate trench 810 with at least four surfaces, namely, a top surface 214A (facing away from the substrate 210), an opposing bottom surface 214B (facing the substrate 210), side surfaces 214C and 214D (facing the second semiconductor material layer 214 of other second fin 620).

Figure 14A:
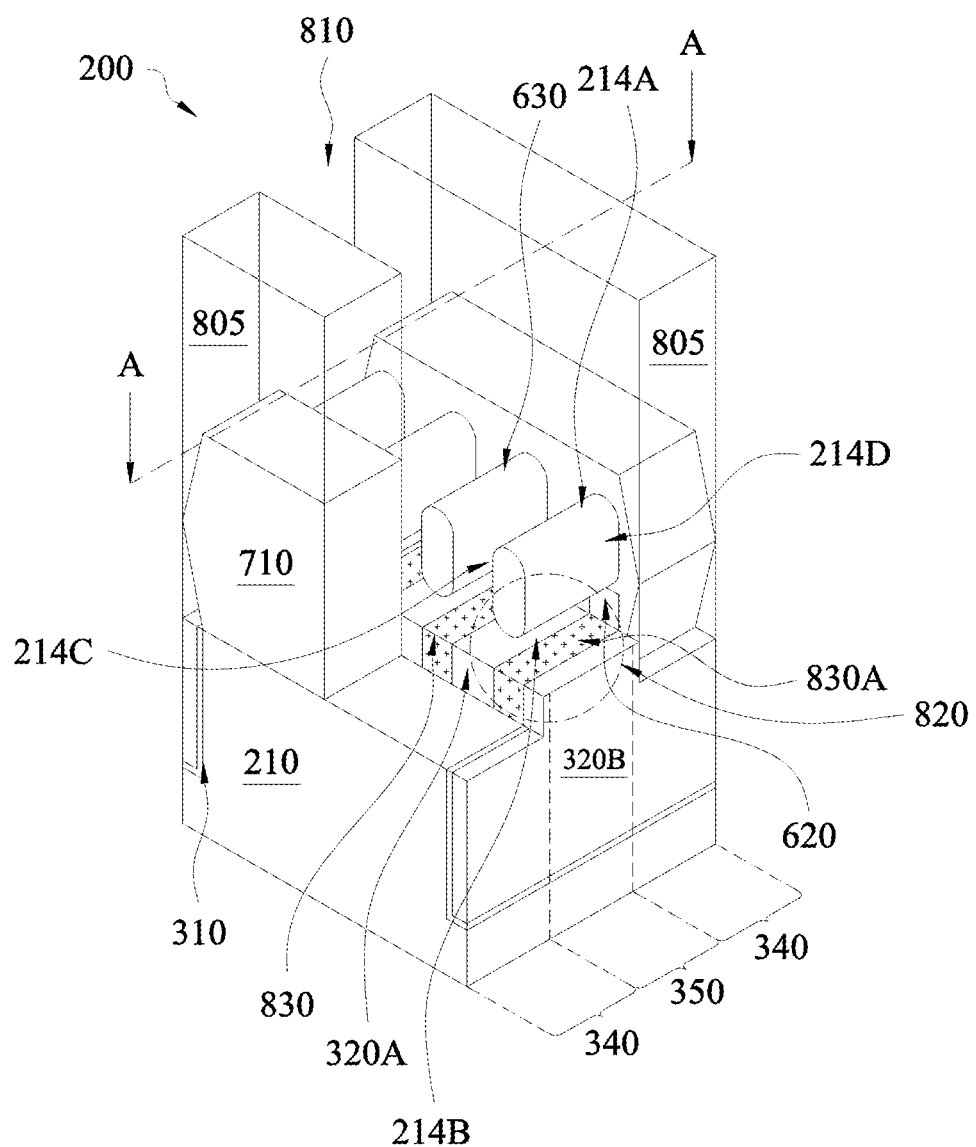
FIG. 14A is a diagrammatic perspective view of an example FinFET device undergoing processes in accordance with some embodiments.
Figure 14B:
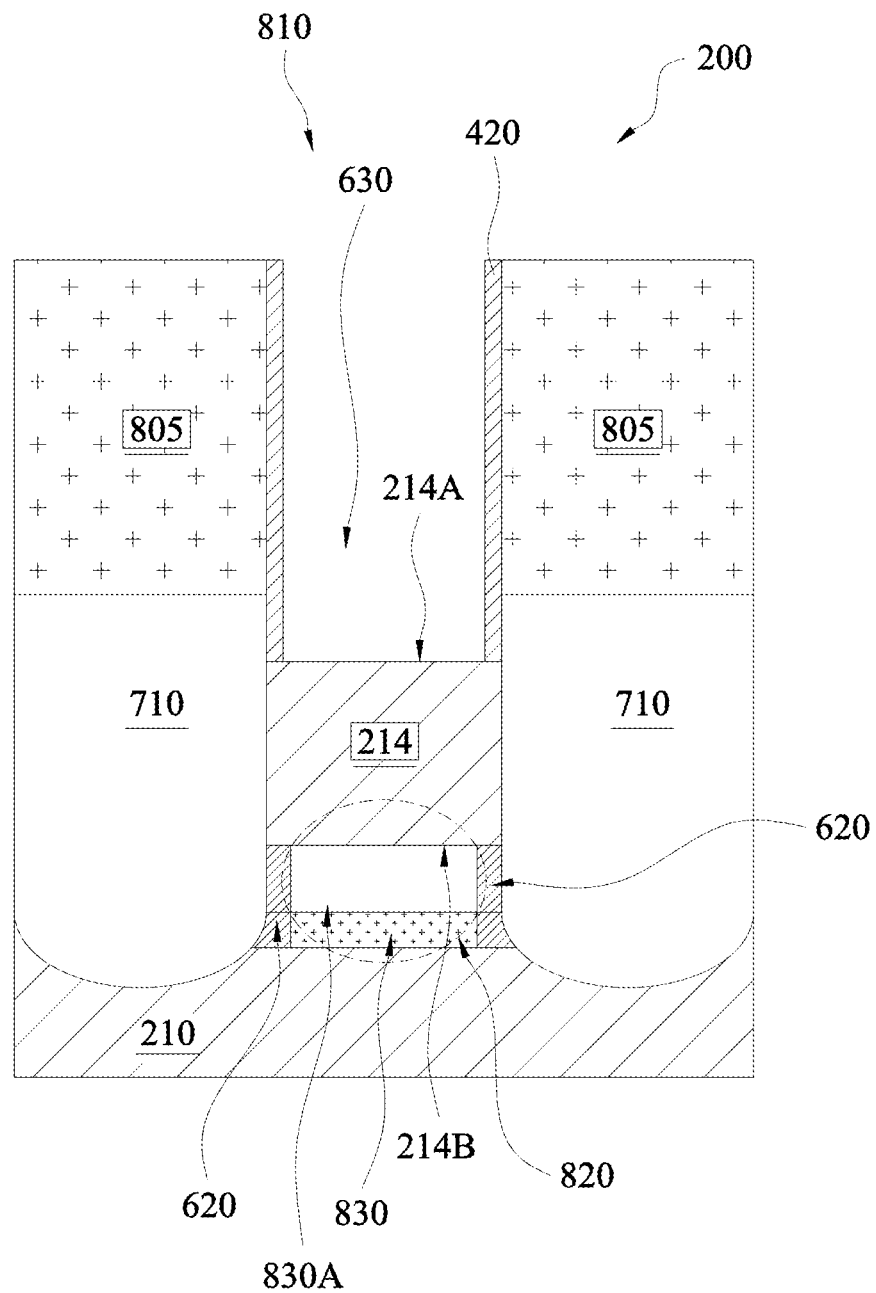
FIG. 14B is a cross-sectional view of an example FinFET device alone the line A-A in FIG. 14A at fabrication stages constructed according to the method of FIG. 1.

Referring to FIGS. 1 and 14A-14B, the method 100 proceeds to step 126 by performing a thermal oxidation process to convert the embedded portion of the first semiconductor material layer 212B of the second fin 630 in the gate region 350 to a first semiconductor oxide layer 830. The first semiconductor oxide layer 830 has a top surface facing away the substrate 210, referred to as a top surface 830A. In one embodiment, the embedded portion of the first semiconductor material layer 212B is fully converted to the first semiconductor oxide layer 830. As an example, the embedded portion of the first semiconductor material layer 212B includes silicon germanium (SiGe) and it is fully converted to the silicon germanium oxide (SiGeO) layer 830 and it has a similar thickness as dielectric layer 320A. In another embodiment, the embedded portion of the first semiconductor material layer 212B is partially converted, such that an outter layer of the embedded portion of the first semiconductor material layer 212B is converted to the first semiconductor oxide layer 830. In one embodiment, the thermal oxidation process is conducted in oxygen ambient. In another embodiment, the thermal oxidation process is conducted in a combination of steam ambient and oxygen ambient.

In the present embodiment, the thermal oxidation process is controlled such that the embedded portion of the first semiconductor material layer 212B oxidizes much faster than the second semiconductor material layers 214. In that regard, a second semiconductor oxide layer (not shown) is formed in the second semiconductor material layer 214 during the thermal oxidation. As an example, the thermal oxidation process is performed in a $H_2O$ reaction gas with a temperature ranging from about 400° C. to about 600° C. and under a pressure ranging from about 1 atm. to about 20 atm. After the oxidation process, a cleaning process is performed to remove the second semiconductor oxide layer over the second semiconductor material layer 214. The cleaning process may be performed using diluted hydrofluoric (DHF) acid.

Referring again to FIGS. 14A and 14B, now the second fin 630 includes the second semiconductor material layer 214 as its upper portion, the first semiconductor oxide layer 830 as its lower portion with the dielectric sidewall spacers 620 along its sidewalls and the gap 820, between the second semiconductor material layer 214 and the first semiconductor oxide layer 830. The upper portion of the second fin 630 physically contacts to the crown-S/D feature 710. The dielectric sidewall spacers 620 along sidewalls of the first semiconductor oxide layer 830 physically contacts the crown-S/D feature 710 and extends from substrate 210, along sidewalls of the first semiconductor oxide layer 830, through the gap 820 and upwards to reach to the second semiconductor material layer 214.

Figure 15A:
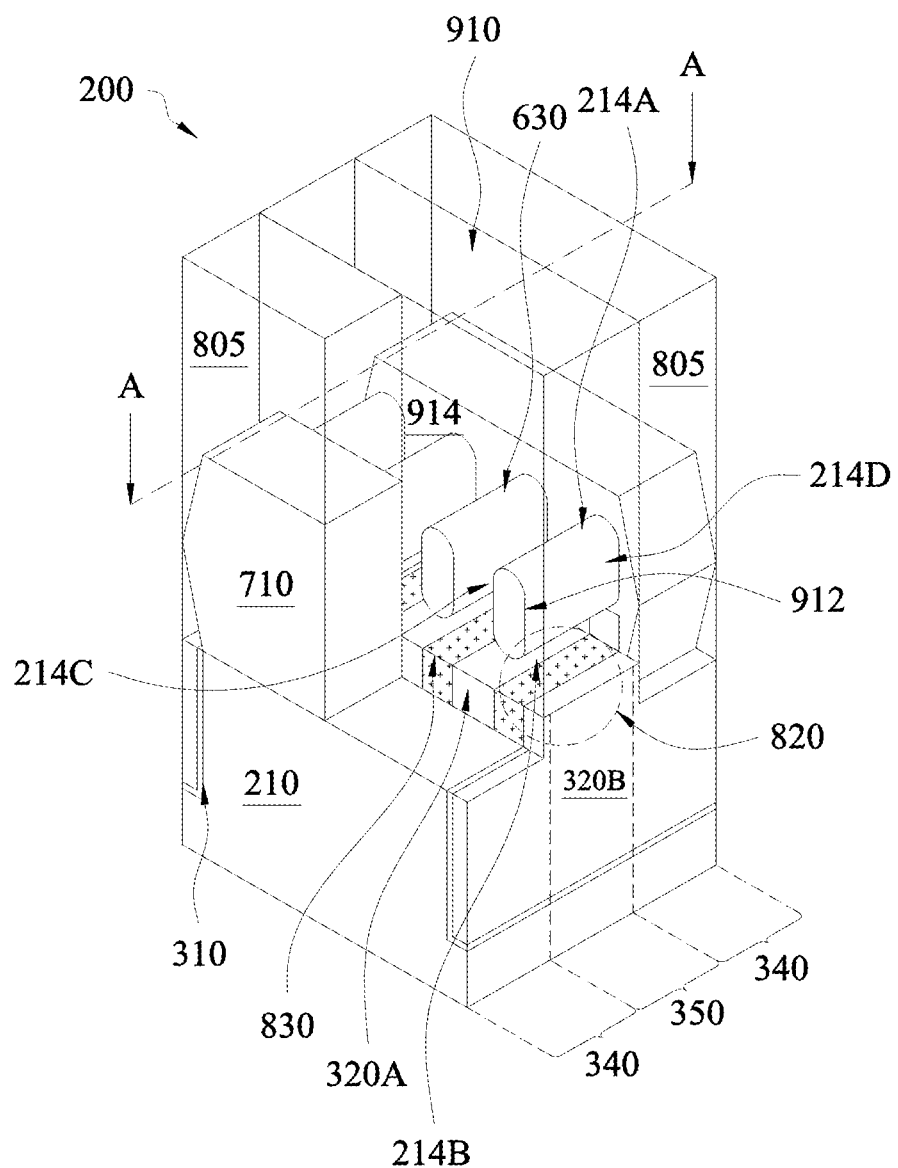
FIG. 15A is a diagrammatic perspective view of an example FinFET device undergoing processes in accordance with some embodiments.
Figure 15B:
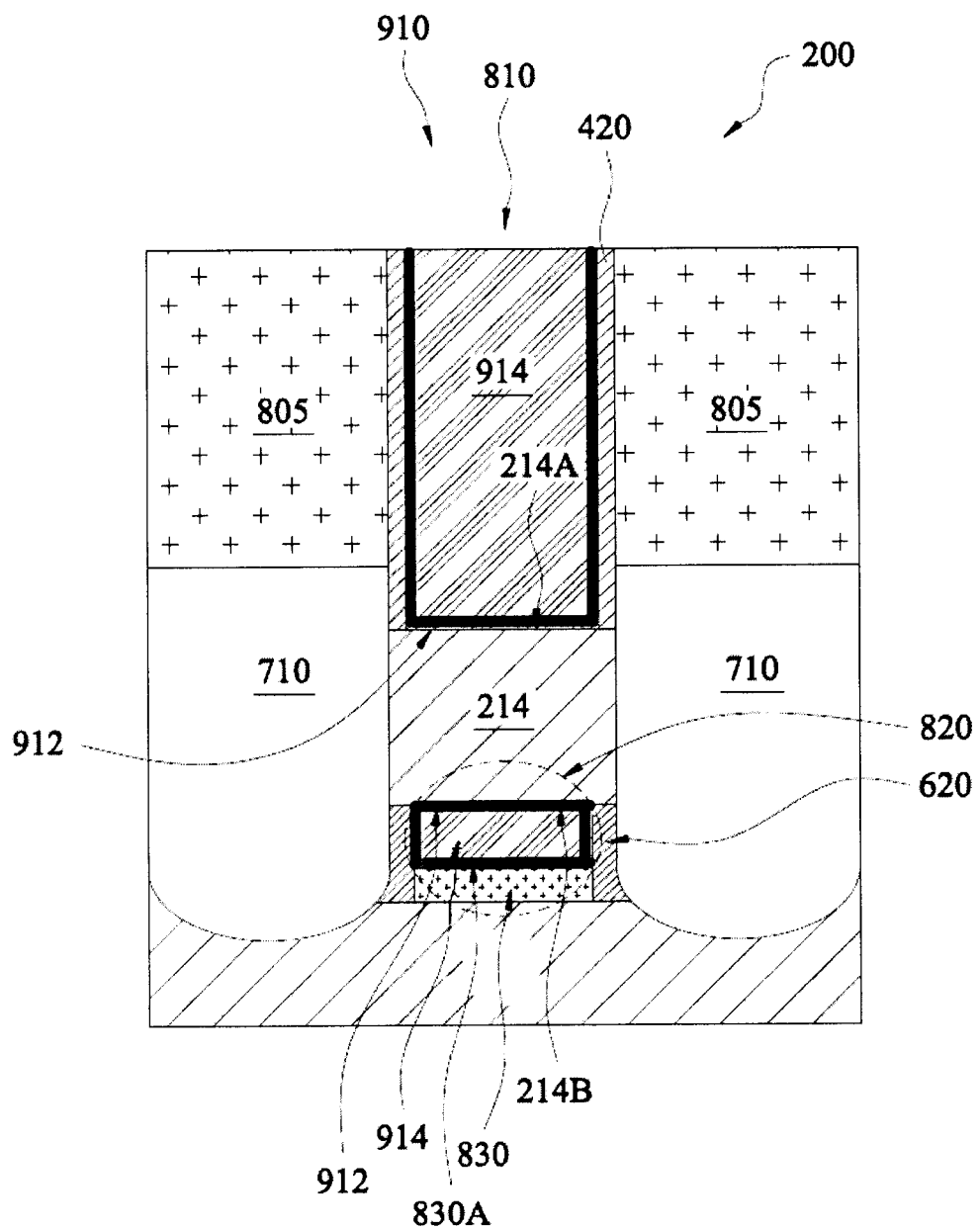
FIG. 15B is a cross-sectional view of an example FinFET device alone the line A-A in FIG. 15A at fabrication stages constructed according to the method of FIG. 1.

Referring to FIGS. 1 and 15A-15B, the method 100 proceeds to step 128 by forming a high-k/metal gate (HK/MG) stack 910 over the substrate 210, including wrapping over the second fins 630 in the gate trench 810. The HK/MG stacks 910 includes gate dielectric layer 912 and MG electrode 914. In one embodiment, the gate dielectric layer 912 includes an interfacial layer (IL) and a HK dielectric layer deposited over the IL. The IL may include silicon oxide, HfSiO and oxynitride (SiON), oxynitride. The HK dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, SiON, or other suitable materials. The gate dielectric layer 912 may be deposited by atomic layer deposition (ALD), thermal oxidation or ozone oxidation, CVD, metal-organic CVD (MOCVD), physical vapor deposition (PVD), other suitable technique, or a combination thereof. In the present embodiment, the gate dielectric layer 912 wraps over the exposed surfaces of the second fin 630, 214A, 214B, 214C and 214D, and the top surface 830A of the first semiconductor oxide layer 830 in the gate trench 810.

The MG electrode 914 is then formed over the gate dielectric layer 912, including filling in the gap 820. The MG electrode 914 may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide). The MG electrode 914 may include Ti, Ag, Al, TiAlN, TaC, TaCN, TaSiN, Mn, Zr, TiN, TaN, Ru, Mo, Al, WN, Cu, W, any suitable materials or a combination thereof. The MG electrode 914 may be deposited by ALD, PVD, CVD, or other suitable process. A CMP process may be performed to remove excessive MG electrode.

In the present embodiment, the HK/MG stack 910 wraps over the second semiconductor material layer 214 of the second fin 630, including warping over the bottom surface 214B. Therefore the HK/MG stack 910 is a quad gate stack, which may achieve a better short-channel-effect, especially for gate length scaling. The HK/MG stacks 910, as well as the second semiconductor material layer 214 of the second fin 630, are isolated from the substrate 210 by the first dielectric layer 830. The dielectric sidewall spacer s 630 separates the HK/MG 910 from the S/D feature 710 to reduce electric leakage. A multiple HK/MG stacks 910 locate between two adjacent isolation features 232 have a common MG electrode 914. The crown-S/D feature 710 connects to the multiple HK/MG stacks 910 by their common MG electrode 914 between two adjacent isolation features 232, which provide a strain booster by a larger volume of S/D feature.

The FinFET device 200 may undergo further CMOS or MOS technology processing to form various features and regions known in the art. For example, subsequent processing may form various contacts/vias/lines and multilayers interconnect features (e.g., metal layers and interlayer dielectrics) on the substrate 210, configured to connect the various features to form a functional circuit that includes one or more FinFET field-effect transistors. In furtherance of the example, a multilayer interconnection includes vertical interconnects, such as vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Figure 15C:
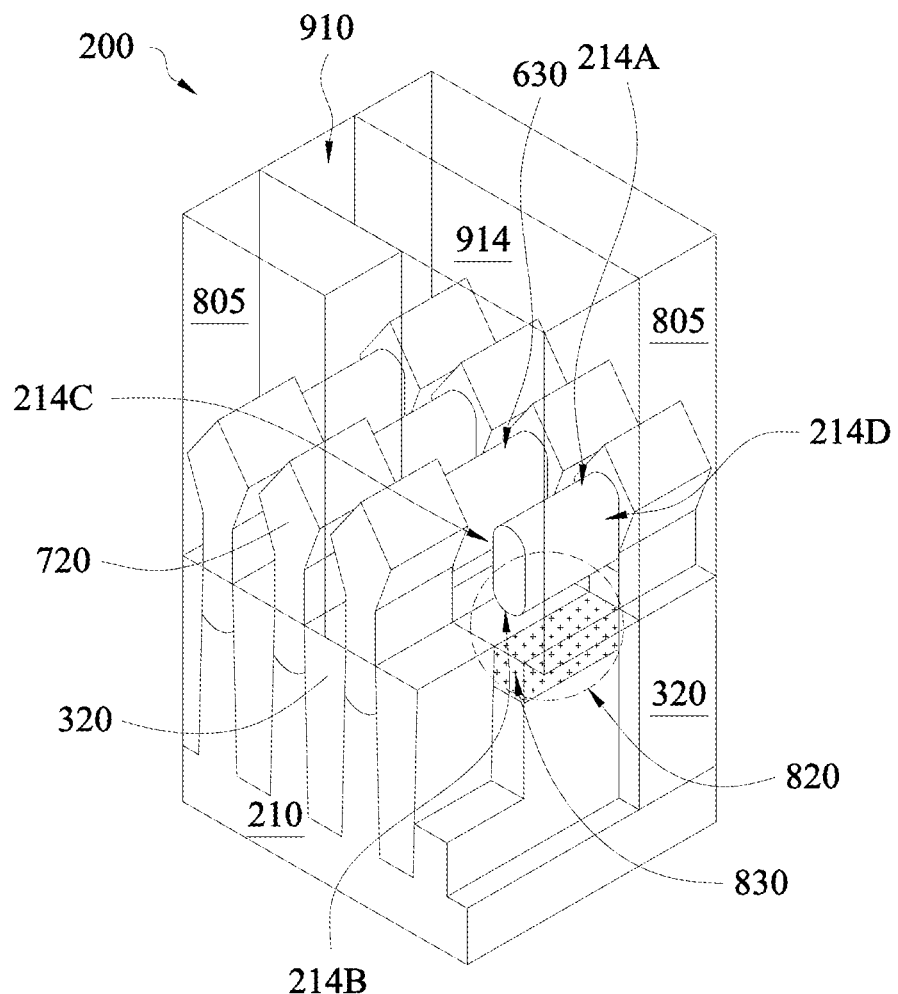
FIG. 15C is a diagrammatic perspective view of an example FinFET device undergoing processes in accordance with some embodiments.

Additional operations may be implemented before, during, and after the method 100, and some operations described above may be replaced or eliminated for other embodiments of the method. As an example, instead of forming the crown- S/D feature, individuals S/D features 720 are formed, as shown in FIG. 15C, by a similar process flow as the method 100.

Based on the above, the present disclosure offers structures of a FinFET. The structures employ a quad gate stack with dielectric sidewall spacers to improve the short-channel-effect. The structures also employ a semiconductor oxide layer to separate the gate stack from the substrate to improve electric isolation.

The present disclosure provides an embodiment of a fin-like field-effect transistor (FinFET) device. The device includes a fin structure disposed over a substrate. The fin structure includes a semiconductor oxide layer disposed over the substrate, which has a top surface facing away from the substrate, a first semiconductor material layer disposed over and spaced apart from the semiconductor oxide layer, which has a top surface facing away from the substrate and an opposing bottom surface facing the substrate, and a dielectric sidewall spacer disposed along a sidewall of the semiconductor oxide layer and extending to the first semiconductor material layer. The device also includes a gate dielectric layer disposed over the fin structure. The gate dielectric layer physically contacts the top surface and the bottom surface of the first semiconductor layer and physically contacts the top surface of the semiconductor oxide layer. The device also includes a gate electrode layer disposed over the gate dielectric layer. The gate electrode extends between the top surface of the semiconductor oxide layer and the bottom surface of the first semiconductor material layer.

The present disclosure also provides another embodiment of a fin-like field-effect transistor (FinFET) device. The device includes a fin structure disposed over a substrate. The fin structure includes a semiconductor oxide layer disposed over the substrate. The semiconductor oxide layer has a top surface facing away from the substrate. The fin structure also includes a first semiconductor material layer disposed over and spaced apart from the semiconductor oxide layer. The first semiconductor material layer has a top surface facing away from the substrate and an opposing bottom surface facing the substrate. The fin structure also includes a dielectric sidewall spacer disposed along a sidewall of the semiconductor oxide layer and extending to the first semiconductor material layer. The device also includes a high-k/metal gate (HK/MG) disposed over the fin structure, which extends between the top surface of the semiconductor oxide layer and the bottom surface of the first semiconductor material layer. The device also includes a source/drain (S/D) feature adjacent to the fin-like structure. The S/D features physically contacts the dielectric sidewall spacer and the first semiconductor material layer.

The present disclosure also provides a method for fabricating a FinFET. The method includes forming fin structures and trenches over a substrate. The fin structure includes a first semiconductor material layer over the substrate and a second semiconductor layer over the first semiconductor material layer. The method also includes filling trenches with a dielectric layer, recessing the dielectric layer down to expose an upper portion and embed a lower portion of the first semiconductor material layer, forming lateral trenches in the first semiconductor material layer, forming dielectric sidewall spacers in lateral trenches, removing the exposed the first semiconductor material layer to form a gap between the embedded the first semiconductor material layer and the second semiconductor material layer. The method also includes performing a thermal oxidation process to convert the embedded first semiconductor material layer to a semiconductor oxide layer and forming high-k/metal gate (HK/MG) over the fin structure, including filling in the gap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin-like field-effect transistor (FinFET) device comprising:
   a fin structure disposed over a substrate, the fin structure including:
      a semiconductor oxide layer disposed over the substrate, wherein the semiconductor oxide layer has a top surface facing away from the substrate;
      a first semiconductor material layer disposed over and spaced apart from the semiconductor oxide layer, wherein the first semiconductor material layer has a top surface facing away from the substrate and an opposing bottom surface facing the substrate; and
      a dielectric sidewall spacer disposed along a sidewall of the semiconductor oxide layer and extending to the first semiconductor material layer;
   a gate dielectric layer disposed over the fin structure, wherein the gate dielectric layer physically contacts the top surface and the bottom surface of the first semiconductor layer and physically contacts the top surface of the semiconductor oxide layer; and
   a gate electrode layer disposed over the gate dielectric layer, wherein the gate electrode extends between the top surface of the semiconductor oxide layer and the bottom surface of the first semiconductor material layer.

2. The device of claim 1, further comprising:
   a source/drain (S/D) feature adjacent to the fin-like structure, including:
      a second semiconductor material layer over the substrate, wherein the second semiconductor material layer has a different material than the first semiconductor material layer.

3. The device of claim 2, wherein the S/D feature physically contacts the dielectric sidewall spacer.

4. The device of claim 2, wherein the S/D feature physically contacts the first semiconductor material layer.

5. The device of claim 1, wherein the gate electrode layer is isolated from the S/D feature by the dielectric sidewall spacer.

6. The device of claim 1, wherein the gate electrode layer is isolated from the substrate by the semiconductor oxide layer member.

7. The device of claim 1, wherein:
   the semiconductor oxide layer includes silicon germanium oxide (SiGeO);
   the first semiconductor material layer includes silicon (Si);
   the dielectric sidewall spacer includes silicon nitride;
   the gate dielectric layer includes high-k dielectric layer; and
   the gate electrode layer includes metal gate layer.

8. The device of claim 1, further comprising:
   a plurality of isolation features over the substrate, wherein:

a multiple of the fin-like structures, wrapped by the gate dielectric layer and the gate electrode layer, disposed between two adjacent isolation features; and the S/D feature disposed between two adjacent isolation features.

9. The device of claim 8, wherein the multiple of the fin-like structures, between two adjacent isolation features, have a common gate electrode layer.

10. The device of claim 8, wherein the S/D feature physically contacts to the respective first semiconductor material layer of each of the multiple fin-like structures.

11. A fin-like field-effect transistor (FinFET) device comprising:
   a fin structure disposed over a substrate, the fin structure including:
      semiconductor oxide layer disposed over the substrate, wherein the semiconductor oxide layer has a top surface facing away from the substrate;
      a first semiconductor material layer disposed over and spaced apart from the semiconductor oxide layer, wherein the first semiconductor material layer has a top surface facing away from the substrate and an opposing bottom surface facing the substrate; and
      a dielectric sidewall spacer disposed along a sidewall of the semiconductor oxide layer and extending to the first semiconductor material layer;
   a high-k/metal gate (HK/MG) disposed over the fin structure, wherein the HK/MG gate extends between the top surface of the semiconductor oxide layer and the bottom surface of the first semiconductor material layer; and
   a source/drain (S/D) feature adjacent to the fin-like structure, wherein the S/D features physically contacts:
      the dielectric sidewall spacer; and
      the first semiconductor material layer;
   a gate dielectric layer disposed over the fin structure, wherein the gate dielectric layer physically contacts the top surface and the bottom surface of the first semiconductor layer and physically contacts the top surface of the semiconductor oxide layer; and
   a gate electrode layer disposed over the gate dielectric layer, wherein the gate electrode extends between the top surface of the semiconductor oxide layer and the bottom surface of the first semiconductor material layer.

12. The device of claim 11, wherein the HK/MG is isolated from the S/D feature by the dielectric sidewall spacer.

13. The device of claim 11, wherein the HK/MG is isolated from the substrate by the semiconductor oxide layer.

14. The device of claim 11, further comprising:
   isolation features over the substrate;
   an additional plurality of fin-like structures, each of the additional plurality of fin-like structures having a HK/MG disposed between two adjacent isolation features.

15. The device of claim 14, wherein each of the FIK/MGs of the additional of the fin-like structures between two adjacent isolation features, have a common HK/MG.

16. The device of claim 15, wherein a S/D feature of each of the additional plurality of fin-like structures physically contacts a semiconductor material layer of each of the additional plurality of fin-like structures.

17. A fin-like field-effect transistor (FinFET) device comprising:
   a fin structure disposed over a substrate, the fin structure including:
      a semiconductor oxide layer disposed over the substrate;
      a first semiconductor material layer disposed over and spaced apart from the semiconductor oxide layer; and
      a dielectric sidewall spacer disposed along a sidewall of the semiconductor oxide layer and extending to the first semiconductor material layer;
   a gate dielectric layer disposed over and physically contacting a top surface and a bottom surface of the first semiconductor layer; and
   a gate electrode layer disposed over the gate dielectric layer, wherein the gate electrode extends between the top surface of the semiconductor oxide layer and the bottom surface of the first semiconductor material layer.

18. The device of claim 17, wherein the gate dielectric layer is disposed over and physically contacts a top surface of the semiconductor oxide layer.

19. The device of claim 17, wherein an outer surface of the dielectric sidewall spacer is coplanar with an outer surface of the first semiconductor material layer.

20. The device of claim 17, wherein the gate electrode layer is isolated from the substrate by the semiconductor oxide layer member.

* * * * *